United States Patent
Sato

(10) Patent No.: US 7,460,674 B2
(45) Date of Patent: Dec. 2, 2008

(54) AUDIO EFFECTOR CIRCUIT

(75) Inventor: Hiroaki Sato, Maebashi (JP)

(73) Assignee: Victor Company of Japan, Ltd., Yokohama (JP)

( * ) Notice: Subject to any disclaimer, the term of this patent is extended or adjusted under 35 U.S.C. 154(b) by 1130 days.

(21) Appl. No.: 10/702,520

(22) Filed: Nov. 7, 2003

(65) Prior Publication Data

US 2004/0096068 A1 May 20, 2004

(30) Foreign Application Priority Data

Nov. 14, 2002 (JP) ............................. 2002-330322

(51) Int. Cl.
*H03G 3/00* (2006.01)
*H03G 7/00* (2006.01)
(52) U.S. Cl. .................... 381/61; 381/104; 381/107; 381/109; 381/106
(58) Field of Classification Search .................. 381/61, 381/104, 107, 106, 109; 84/603
See application file for complete search history.

(56) References Cited

U.S. PATENT DOCUMENTS 5,025,700 A * 6/1991 Morikawa et al. ............. 84/603
5,473,108 A * 12/1995 Matsuda et al. .............. 84/622
6,122,381 A * 9/2000 Winterer ...................... 381/17

FOREIGN PATENT DOCUMENTS

JP 63-16712 2/1988

* cited by examiner

*Primary Examiner*—Vivian Chin
*Assistant Examiner*—George Monikang
(74) *Attorney, Agent, or Firm*—Louis Woo

(57) ABSTRACT

An audio effector circuit includes a first automatic level control circuit for processing an input audio signal into a first control-resultant audio signal, and a second automatic level control circuit for processing the input audio signal into a second control-resultant audio signal. The first automatic level control circuit has a first predetermined attack time and a first predetermined release time longer than the first predetermined attack time. The second automatic level control circuit has a second predetermined attack time and a second predetermined release time. The second predetermined attack time is longer than the first predetermined attack time. The second predetermined release time is substantially equal to the first predetermined release time. A subtracter operates for providing a difference signal representing a difference between the first control-resultant signal and the second control-resultant signal. An adder operates for adding the difference signal to the input audio signal.

3 Claims, 3 Drawing Sheets

AUDIO EFFECTOR CIRCUIT

BACKGROUND OF THE INVENTION

1. Field of the Invention

This invention generally relates to an audio apparatus. This invention particularly relates to an audio effector circuit for processing an audio signal to make livelier the music represented by the audio signal.

2. Description of the Related Art

There are various audio effector circuits for processing an audio signal to make livelier the music represented by the audio signal. The audio effector circuits are of a static type and a dynamic type. Examples of the static circuits are a tone control circuit, a graphic equalizer circuit, and a bass boost circuit designed to change the signal amplification gain in a specific frequency range which is fixed or variable. An example of the dynamic circuits is an amplitude expander designed to expand differences between small amplitudes and large amplitudes of an audio signal. Another example of the dynamic circuits is an automatic level control (ALC) circuit having a longer attack time.

For human's sense of hearing, the boost of audio-signal components in a particular frequency range effectively causes the music represented by the resultant audio signal to be livelier.

In the case where an audio signal from a certain music source (for example, a rock-and-roll music source) is processed by a static audio effector circuit such as a tone control circuit or an equalizer circuit which is tuned to the particular frequency range, the music represented by the processing-resultant audio signal can be effectively livelier. On the other hand, in the case where an audio signal from a classical music source is processed by that static audio effector circuit, the music represented by the processing-resultant audio signal tends to be unnatural.

Also, in the case of the processing of an audio signal by a dynamic audio effector circuit such as an amplitude expander, the result of the processing is good or poor depending on the type of a music source of the audio signal. Generally, the processing result tends to be poor when the audio signal comes from a classical music source.

Japanese utility-model application publication number 63-16712/1988 discloses an automatic level control (ALC) circuit in which the level of an output signal from an amplifier is detected, and an input signal to the amplifier is attenuated in response to the detected output-signal level to hold constant the level of the output signal. The ALC circuit in Japanese application 63-16712/1988 includes a charging transistor having a base to which the output signal from the amplifier is applied via a first capacitor and a resistor. A diode is connected between a ground and the base of the charging transistor. The charging transistor controls the charging of a second capacitor connected between the ground and the emitter of the charging transistor. A transistor combination generates a control signal in response to the voltage across the second capacitor. An ALC transistor has a base subjected to the control signal. The ALC transistor attenuates the input signal to the amplifier in response to the control signal.

SUMMARY OF THE INVENTION

It is an object of this invention to provide an audio effector circuit having a variable effect which can fit to the audio signals from different music sources.

A first aspect of this invention provides an audio effector circuit comprising a first automatic level control circuit for subjecting an input audio signal to automatic level control to generate a first control-resultant audio signal, the first automatic level control circuit having a first predetermined attack time and a first predetermined release time longer than the first predetermined attack time; a second automatic level control circuit for subjecting the input audio signal to automatic level control to generate a second control-resultant audio signal, the second automatic level control circuit having a second predetermined attack time and a second predetermined release time, the second predetermined attack time being longer than the first predetermined attack time, the second predetermined release time being substantially equal to the first predetermined release time; a subtracter for providing a difference signal representing a difference between the first control-resultant signal generated by the first automatic level control circuit and the second control-resultant signal generated by the second automatic level control circuit; and an adder for adding the difference signal generated by the subtracter to the input audio signal.

A second aspect of this invention is based on the first aspect thereof, and provides an audio effector circuit further comprising a low pass filter through which the input audio signal passes before reaching the first and second automatic level control circuits.

A third aspect of this invention is based on the first aspect thereof, and provides an audio effector circuit further comprising a low pass filter through which the difference signal passes before reaching the adder.

A fourth aspect of this invention provides an audio effector circuit comprising first means for generating an effect signal on the basis of a time-domain portion of an input audio signal which increases in amplitude at a high rate; and second means for adding the effect signal generated by the first means to the input audio signal.

A fifth aspect of this invention provides an audio effector circuit comprising first means for generating, from an input audio signal, an effect signal being stronger as a rate of an increase in amplitude of the input audio signal is higher; and second means for adding the effect signal generated by the first means to the input audio signal.

DETAILED DESCRIPTION OF THE INVENTION

A prior-art audio effector circuit will be explained below for a better understanding of this invention.

Figure 1:
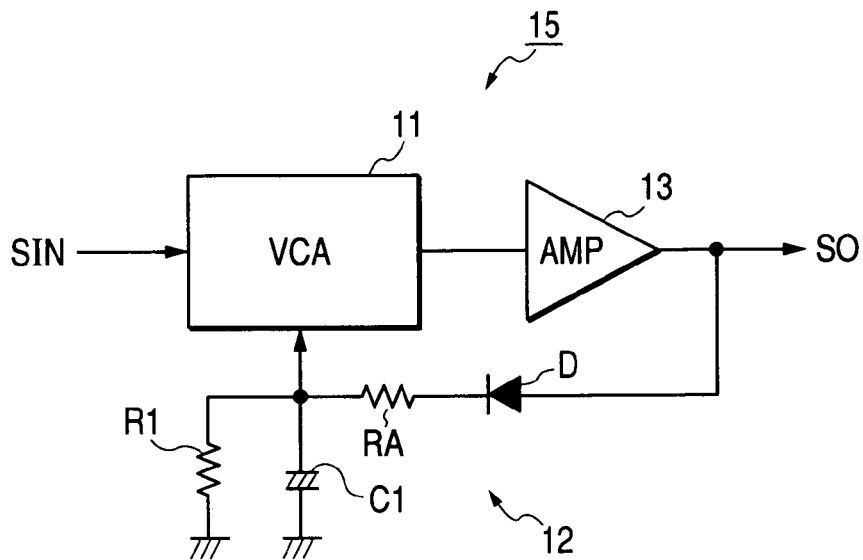
FIG. 1 is a diagram of an automatic level control (ALC) circuit included in a prior-art audio effector circuit.

With reference to FIG. 1, the prior-art audio effector circuit includes an automatic level control (ALC) circuit 15 which is also referred to as an automatic volume control (AVC) circuit 15. The prior-art ALC circuit 15 includes an amplifier, and a section for automatically varying the gain of the amplifier in accordance with the amplitude of an output signal from the amplifier.

As shown in FIG. 1, the prior-art ALC circuit 15 has a voltage-controlled amplifier (VCA) circuit 11, a feedback circuit 12, and an amplifier 13. The VCA circuit 11 is followed by the amplifier 13. The feedback circuit 12 is connected between the output terminal of the amplifier 13 and a control terminal of the VCA circuit 11. The feedback circuit 12 includes a combination of a diode D, a resistor RA, a capacitor C1, and a resistor R1.

The input audio signal SIN is fed to the VCA circuit 11. The input audio signal SIN is successively amplified by the VCA circuit 11 and the amplifier 13. The diode D in the feedback circuit 12 rectifies an output audio signal SO from the amplifier 13 to get a rectification-resultant signal. The resistors RA and RA, and the capacitor C1 in the feedback circuit 12 compose an RC circuit which follows the diode D, and which charges the capacitor C1 in response to the rectification-resultant signal and discharges the capacitor C1 to get a control voltage thereacross. The control voltage depends on the amplitude of the output audio signal SO from the amplifier 13. The control voltage is applied to the VCA circuit 11 so that the gain of the VCA circuit 11 will be adjusted in accordance with the control voltage. The gain adjustment is designed to implement automatic level control.

Parameters of operation characteristics of the prior-art ALC circuit 15 include an attack time TA and a release time TR which are defined as follows.

Figure 2:
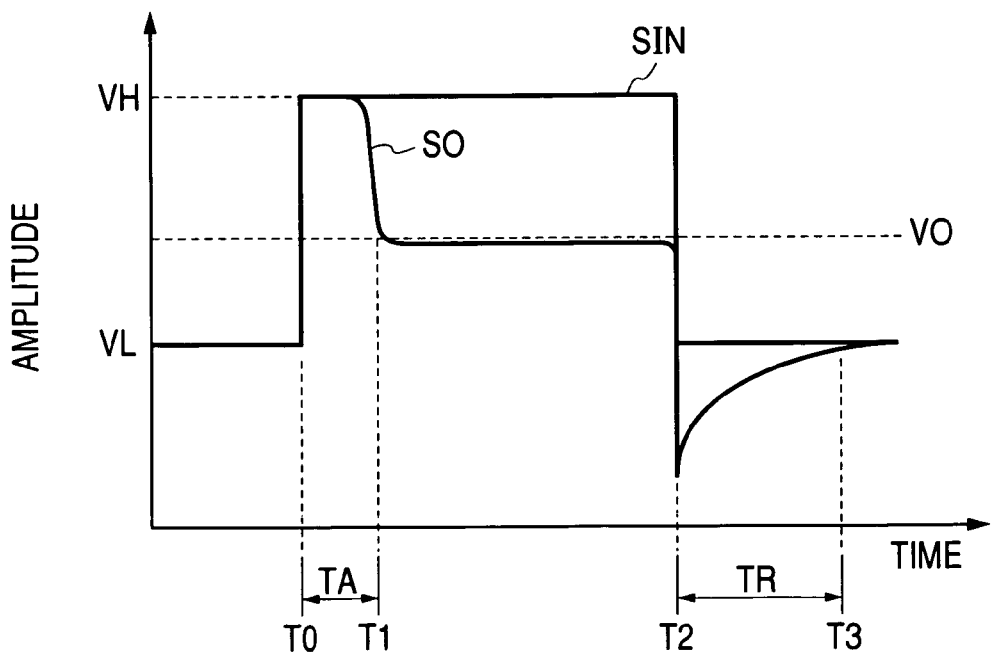
FIG. 2 is a time-domain diagram of signals in the ALC circuit of FIG. 1.

With reference to FIG. 2, the amplitude of the input audio signal SIN abruptly increases from a low value VL to a high value VH and thus exceeds a threshold value for the level control (the automatic level control) at a moment T0. Then, the amplitude of the input audio signal SIN remains at the high value VH until a moment T2. The amplitude of the input audio signal SIN abruptly decreases from the high value VH to the low value VL at the moment T2. Thus, the amplitude of the input audio signal SIN decreases below the threshold value for the level control at the moment T2. Then, the amplitude of the input audio signal SIN remains at the low value VL.

The amplitude of the output audio signal SO also increases and thus exceeds a control value (a limit value) VO at the moment T0. The control value VO corresponds to the threshold value for the level control. The prior-art ALC circuit 15 starts the level control in response to the amplitude increase of the output audio signal SO into the range above the control value VO. The level control decreases the amplitude of the output audio signal SO. As a result, the amplitude of the output audio signal SO reaches the control value VO at a moment T1 after the moment T0. The attack time TA is defined as the level-control-start delay time, that is, the time interval between the moments T0 and T1 (the time interval between the moment of the amplitude increase of the input audio signal SIN and the moment at which the amplitude of the output audio signal SO is decreased to the control value VO by the level control). Then, the level control holds the amplitude of the output audio signal SO at the control value VO until the moment T2. At the moment T2, the amplitude of the output audio signal SO decreases from the control value VO to an unduly low value caused by a trailing lag of the level control. The unduly low value means a value significantly lower than a normal value which harmonizes with the amplitude of the input audio signal SIN. At the moment T2, the amplitude of the input audio signal SIN decreases below the threshold value for the level control. As a result, the level control moves toward a suspended state (an inactive state) while the input audio signal SIN starts to be released from the level control. Then, the amplitude of the output audio signal SO continues to be increased. At a moment T3 after the moment T2, the amplitude of the output audio signal SO reaches the normal value. The release time TR is defined as the time interval between the moments T2 and T3, that is, the level-control-end delay time (the time interval between the moment of the amplitude decrease of the input audio signal SIN and the moment at which the amplitude of the output audio signal SO is increased to the normal value due to the release from the level control).

In the prior-art ALC circuit 15, the attack time TA is very short while the release time TR is relatively long. The release time TR is decided by the time constant of the combination of the resistor R1 and the capacitor C1. The capacitor C1 can be discharged through the resistor R1. The attack time TA is decided by the time constant of the combination of the resistor RA and the capacitor C1. The capacitor C1 can be charged by a current flowing through the resistor RA. The resistor RA has a small value close to 0 ohm.

Embodiment

Figure 3:
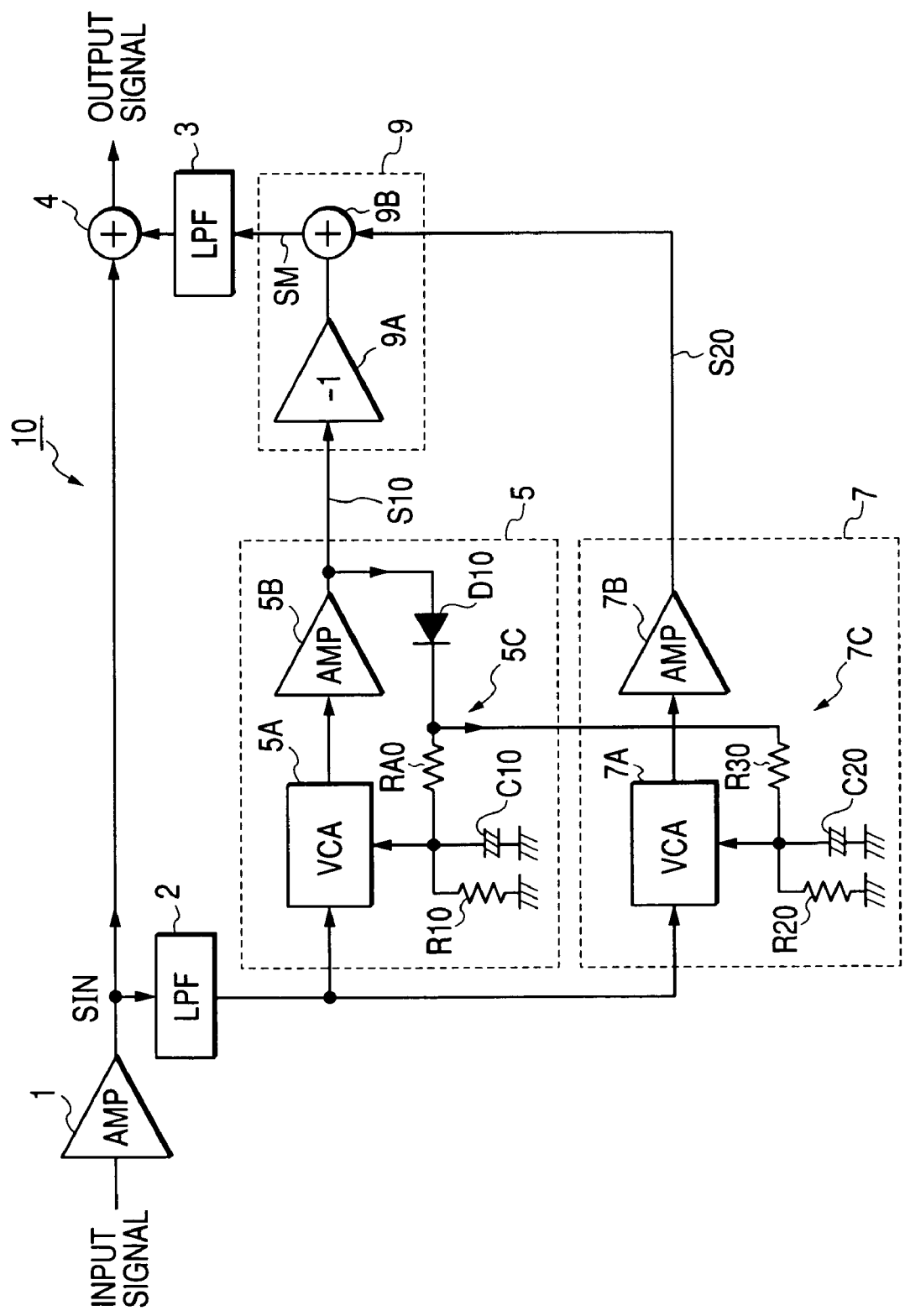
FIG. 3 is a diagram of an audio effector circuit according to an embodiment of this invention.

FIG. 3 shows an audio effector circuit 10 according to an embodiment of this invention. As shown in FIG. 10, the audio effector circuit 10 includes a buffer amplifier 1, low pass filters (LPFs) 2 and 3, an adder or a summing device 4, automatic level control (ALC) circuits 5 and 7, and a subtracter 9.

The input terminal of the buffer amplifier 1 is subjected to an original input audio signal. The output terminal of the buffer amplifier 1 is connected to the input terminal of the low pass filter 2 and a first input terminal of the adder 4. The output terminal of the low pass filter 2 is connected to the input terminals of the ALC circuits 5 and 7. The ALC circuit 5 and 7 are connected with each other. The output terminal of the ALC circuit 5 is connected to a first input terminal of the subtracter 9. The output terminal of the ALC circuit 7 is connected to a second input terminal of the subtracter 9. The output terminal of the subtracter 9 is connected to the input terminal of the low pass filter 3. The output terminal of the low pass filter 3 is connected to a second input terminal of the adder 4. An output audio signal of the audio effector circuit 10 appears at the output terminal of the adder 4.

It should be noted that the low pass filters 2 and 3 may be omitted. In this case, the output terminal of the buffer amplifier 1 is directly connected to the input terminals of the ALC circuits 5 and 7, and the output terminal of the subtracter 9 is directly connected to the second input terminal of the adder 4.

The ALC circuit 5 includes a voltage-controlled amplifier (VCA) circuit 5A, an amplifier 5B, and a feedback circuit 5C. The feedback circuit 5C has a diode D10, resistors RA0 and R10, and a capacitor C10. The input terminal of the VCA circuit 5A is connected to the output terminal of the low pass filter 2. The output terminal of the VCA circuit 5A leads to the input terminal of the amplifier 5B. The output terminal of the amplifier 5B leads to the first input terminal of the subtracter 9. The anode of the diode D10 is connected to the output terminal of the amplifier 5B. The cathode of the diode D10 is connected via the resistor RA0 to a first end of the capacitor C10. A second end of the capacitor C10 is grounded. The resistor R10 is connected across the capacitor C10. The junction among the resistors RA0 and R10 and the capacitor C10 is connected to a control terminal of the VCA circuit 5A.

The ALC circuit 7 includes a VCA circuit 7A, an amplifier 7B, and a feedback circuit 7C. The feedback circuit 7C has resistors R20 and R30, and a capacitor C20. The input terminal of the VCA circuit 7A is connected to the output terminal of the low pass filter 2. The output terminal of the VCA circuit 7A leads to the input terminal of the amplifier 7B. The output terminal of the amplifier 7B leads to the second input terminal of the subtracter 9. A first end of the capacitor C20 is connected via the resistor R30 to the cathode of the diode D10 in the ALC circuit 5. A second end of the capacitor C20 is grounded. The resistor R20 is connected across the capacitor C20. The junction among the resistors R20 and R30 and the capacitor C20 is connected to a control terminal of the VCA circuit 7A.

Preferably, the VCA circuits 5A and 7A are equal in structure. Also, the amplifiers 5B and 7B are equal in structure.

The subtracter 9 includes a sign inverter 9A, and an adder or a summing device 9B. The input terminal of the sign inverter 9A is connected to the output terminal of the amplifier 5B in the ALC circuit 5. The output terminal of the sign inverter 9A leads to a first input terminal of the adder 9B. A second input terminal of the adder 9B is connected to the output terminal of the amplifier 7B in the ALC circuit 7. The output terminal of the adder 9B leads to the input terminal of the low pass filter 3.

The original input audio signal passes through the buffer amplifier 1, and hence becomes a buffering-resultant input audio signal SIN which appears at the output terminal of the buffer amplifier 1. The input audio signal SIN is fed to the low pass filter 2 and the adder 4. The low pass filter 2 removes high-frequency noise components from the input audio signal SIN, and generates a filtering-resultant audio signal. The low pass filter 2 outputs the filtering-resultant audio signal to the VCA circuits 5A and 7A in the ALC circuits 5 and 7.

The VCA circuit 5A in the ALC circuit 5 amplifies or attenuates the output audio signal from the low pass filter 2 at a gain depending on a first control voltage. The VCA circuit 5A generates a first amplification-resultant audio signal (or an attenuation-resultant audio signal), and outputs it to the amplifier 5B. The device 5B amplifies the output audio signal from the VCA circuit 5A at a fixed gain to get a second amplification-resultant audio signal S10. The amplifier 5B outputs the second amplification-resultant audio signal S10 to the sign inverter 9A in the subtracter 9 and the diode D10 in the feedback circuit 5C. The diode D10 rectifies the output audio signal S10 from the amplifier 5B to get a rectification-resultant signal. The resistors RA0 and R10, and the capacitor C10 in the feedback circuit 5C compose an RC circuit which follows the diode D10, and which charges the capacitor C10 in response to the rectification-resultant signal and discharges the capacitor C10 to get the first control voltage thereacross. The first control voltage depends on the amplitude of the output audio signal S10 from the amplifier 5B. The first control voltage is applied to the VCA circuit 5A so that the gain of the VCA circuit 5A will be adjusted in accordance with the first control voltage.

The adjustment of the gain of the VCA circuit 5A is designed to implement automatic level control mentioned hereafter. As the amplitude of the output audio signal from the low pass filter 2 increases across a threshold value for the level control (the automatic level control), the amplitude of the output audio signal S10 from the amplifier 5B increases across a control value (a limit value) VC. The first control voltage which responds to the amplitude increase of the audio signal S10 into the region above the control value VC lowers the gain of the VCA circuit 5A so that the amplitude of the audio signal S10 will decrease to the control value VC. As the amplitude of the output audio signal from the low pass filter 2 decreases across the threshold value for the level control, the amplitude of the output audio signal S10 from the amplifier 5B decreases across the control value VC. The first control voltage which responds to the amplitude decrease of the audio signal S10 into the region below the control value VC returns the gain of the VCA circuit 5A to its original value and hence cancels the level control so that the amplitude of the audio signal S10 will follow the amplitude of the output audio signal from the low pass filter 2. In this way, the amplitude of the output audio signal S10 from the amplifier 5B is limited to within the range equal to or below the control value VC.

The VCA circuit 7A in the ALC circuit 7 amplifies or attenuates the output audio signal from the low pass filter 2 at a gain depending on a second control voltage. The VCA circuit 7A generates a third amplification-resultant audio signal (or an attenuation-resultant audio signal), and outputs it to the amplifier 7B. The device 7B amplifies the output audio signal from the VCA circuit 7A at a fixed gain to get a fourth amplification-resultant audio signal S20. Preferably, the gain of the amplifier 7B is equal to the gain of the amplifier 5B in the ALC circuit 5. The amplifier 7B outputs the fourth amplification-resultant audio signal S20 to the adder 9B in the subtracter 9. The resistors R20 and R30, and the capacitor C20 in the feedback circuit 7C compose an RC circuit which receives the rectification-resultant signal from the diode D10 in the ALC circuit 5, and which charges the capacitor C20 in response to the rectification-resultant signal and discharges the capacitor C20 to get the second control voltage thereacross. The second control voltage depends on the amplitude of the output audio signal S10 from the amplifier 5B in the ALC circuit 5. The second control voltage is applied to the VCA circuit 7A so that the gain of the VCA circuit 7A will be adjusted in accordance with the second control voltage.

The adjustment of the gain of the VCA circuit 7A is designed to implement automatic level control mentioned hereafter. As the amplitude of the output audio signal from the low pass filter 2 increases across the threshold value for the level control, the amplitude of the output audio signal S10 from the amplifier 5B increases across the control value VC. The second control voltage which responds to the amplitude increase of the audio signal S10 into the region above the control value VC lowers the gain of the VCA circuit 7A so that the amplitude of the output audio signal S20 from the amplifier 7B will decrease to the control value VC. As the amplitude of the output audio signal from the low pass filter 2 decreases across the threshold value for the level control, the amplitude of the output audio signal S10 from the amplifier 5B decreases across the control value VC. The second control voltage which responds to the amplitude decrease of the audio signal S10 into the region below the control value VC returns the gain of the VCA circuit 7A to its original value and hence cancels the level control so that the amplitude of the output audio signal S20 from the amplifier 7B will follow the amplitude of the output audio signal from the low pass filter 2. In this way, the amplitude of the output audio signal S20 from the amplifier 7B is limited to within the range equal to or below the control value VC.

The sign inverter 9A receives the audio signal S10 from the amplifier 5B in the ALC circuit 5. The device 9A inverts the polarity or sign of the audio signal S10 to get an inversion-resultant audio signal. The signal inverter 9A outputs the inversion-resultant audio signal to the adder 9B. The adder 9B receives the audio signal S20 from the amplifier 7B in the ALC circuit 7. The device 9B adds or sums the inversion-resultant audio signal and the audio signal S20 to get a first addition-resultant audio signal SM. The first addition-resultant audio signal SM is equal to the output audio signal S20 from the ALC circuit 7 minus the output audio signal S10 from the ALC circuit 5. In other words, the first addition-resultant audio signal SM is equal to the difference (S20−S10) between the audio signals S10 and S20. Thus, the first addition-resultant audio signal SM is also referred to as the difference signal SM. The adder 9B outputs the first addition-resultant audio signal (the difference signal) SM to the low pass filter 3.

The low pass filter 3 removes high-frequency noise components from the output audio signal SM of the adder 9B in the subtracter 9, and generates a filtering-resultant audio signal. The low pass filter 3 outputs the filtering-resultant audio signal to the adder 4.

The device 4 adds or sums the input audio signal SIN and the output audio signal from the low pass filter 3 to get a second addition-resultant audio signal. The adder 4 outputs the second addition-resultant audio signal to a subsequent stage. The output audio signal from the adder 4 is used as an output audio signal from the audio effector circuit 10.

The ALC circuit 5 has an attack time T1A and a release time T1R. The capacitor C10 can be charged by a current flowing through the resistor RA0. The capacitor C10 can be discharged via the resistor R10. The attack time T1A is decided by the time constant of the combination of the resistor RA0 and the capacitor C10. The release time T1R is decided by the time constant of the combination of the resistor R10 and the capacitor C10. The release time T1R is longer than the attack time T1A.

The ALC circuit 7 has an attack time T2A and a release time T2R. The capacitor C20 can be charged by a current flowing through the resistor R30. The capacitor C20 can be discharged via the resistor R20. The attack time T2A is decided by the time constant of the combination of the resistor R30 and the capacitor C20. The release time T2R is decided by the time constant of the combination of the resistor R20 and the capacitor C20. The attack time T2A is longer than the attack time T1A of the ALC circuit 5. The release time T2R is exactly or substantially equal to the release time T1R of the ALC circuit 5.

Preferably, the capacitors C10 and C20 have a same capacitance. For example, the capacitance of the capacitors C10 and C20 is equal to several microfarads. Preferably, the resistors R10 and R20 have a same resistance. For example, the resistance of the resistors R10 and R20 is in the range from several hundreds of kilo-ohms to about 1 megohm. Preferably, the resistor RA0 has a predetermined very small resistance. The resistor R30 has a predetermined resistance greater than that of the resistor RA0. For example, the resistance of the resistor R30 is equal to several hundreds of ohms.

Figure 4:
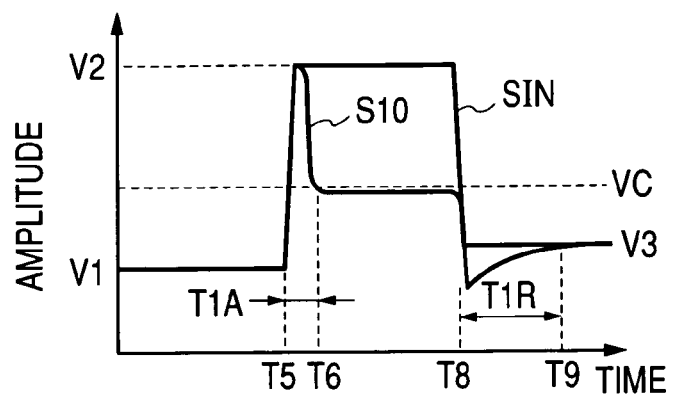
FIG. 4 is a time-domain diagram of signals inputted to and outputted from a first ALC circuit in FIG. 3.
Figure 5:
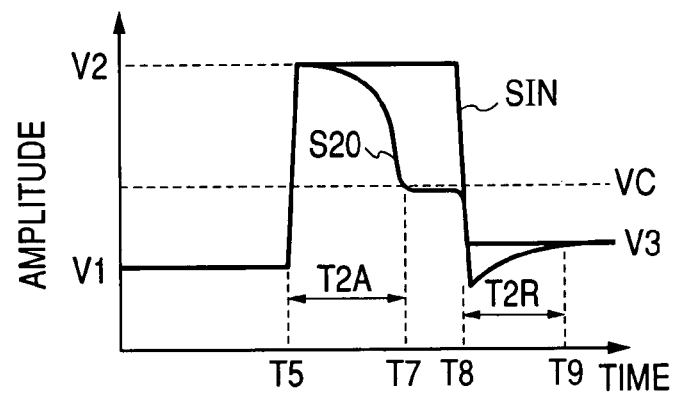
FIG. 5 is a time-domain diagram of signals inputted to and outputted from a second ALC circuit in FIG. 3.

With reference to FIGS. 4 and 5, the amplitude of the input audio signal SIN abruptly increases from a low value V1 to a high value V2 and thus exceeds the threshold value for the level control at a moment T5. Then, the amplitude of the input audio signal SIN remains at the high value V2 until a moment T8. The amplitude of the input audio signal SIN abruptly decreases from the high value V2 to an intermediate value V3 at the moment T8. The intermediate value V3 is higher than the low value V1 and lower than the threshold value for the level control. Thus, the amplitude of the input audio signal SIN decreases below the threshold value for the level control at the moment T8. Then, the amplitude of the input audio signal SIN remains at the intermediate value V3.

The amplitude of the output audio signal S10 from the amplifier 5B in the ALC circuit 5 also increases and thus exceeds the control value VC at the moment T5. The control value VC corresponds to the threshold value for the level control. The ALC circuit 5 starts the level control in response to the amplitude increase of the output audio signal S10 into the range above the control value VC. The level control decreases the amplitude of the output audio signal S10. As a result, the amplitude of the output audio signal S10 reaches the control value VC at a moment T6 spaced afterwards from the moment T5 by a time interval equal to the attack time T1A. Then, the level control holds the amplitude of the output audio signal S10 at the control value VC until the moment T8. At the moment T8, the amplitude of the output audio signal S10 decreases from the control value VC to an unduly low value caused by a trailing lag of the level control. The unduly low value means a value significantly lower than a normal value which harmonizes with the amplitude of the input audio signal SIN. At the moment T8, the amplitude of the input audio signal SIN decreases below the threshold value for the level control. As a result, the level control moves toward a suspended state (an inactive state) while the input audio signal SIN starts to be released from the level control. Then, the amplitude of the output audio signal S10 continues to be increased. At a moment T9 spaced afterwards from the moment T8 by a time interval equal to the release time T1R, the amplitude of the output audio signal S10 reaches the normal value.

At the moment T5, also the ALC circuit 7 starts the level control in response to the amplitude increase of the output audio signal S10 from the ALC circuit 5 into the range above the control value VC. The level control decreases the amplitude of the output audio signal S20 from the ALC circuit 7. As a result, the amplitude of the output audio signal S20 reaches the control value VC at a moment T7 spaced afterwards from the moment T5 by a time interval equal to the attack time T2A. Since the attack time T2A is longer than the attack time T1A, the moment T7 is later than the moment T6. Then, the level control maintains the amplitude of the output audio signal S20 at the control value VC until the moment T8. At the moment T8, the amplitude of the output audio signal S20 decreases from the control value VC to an unduly low value caused by a trailing lag of the level control. At the moment T8, the amplitude of the input audio signal SIN decreases below the threshold value for the level control. As a result, the level control moves toward a suspended state (an inactive state) while the input audio signal SIN starts to be released from the level control. Then, the amplitude of the output audio signal S20 continues to be increased. At the moment T9 spaced afterwards from the moment T8 by the time interval equal to the release time T2R (=T1R), the amplitude of the output audio signal S20 reaches a normal value which harmonizes with the amplitude of the input audio signal SIN.

Figure 6:
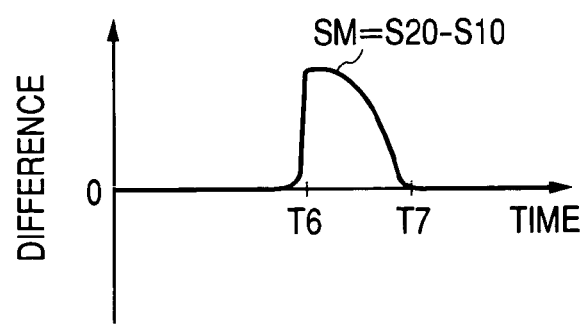
FIG. 6 is a time-domain diagram of a difference signal representing the difference between the output signals from the first and second ALC circuits in FIG. 3.

Since the attack time T2A of the ALC circuit 7 is longer than the attack time T1A of the ALC circuit 5, the output audio signal S10 of the ALC circuit 5 and the output audio signal S20 of the ALC circuit 7 significantly differ from each other during the time interval between the moments T6 and T7. Therefore, as shown in FIG. 6, the difference signal SM, that is, the output audio signal SM (=S20−S10) of the subtracter 9, appreciably deviates from zero during the time interval between the moments T6 and T7. As the rate of an increase in the amplitude of the input audio signal SIN is higher, the difference between the attack times T1A and T2A causes the output audio signal SM (=S20−S10) of the subtracter 9 to more deviate from zero or to be stronger. In other words, the output audio signal SM (=S20−S10) of the subtracter 9 reflects every time-domain portion of the input audio signal SIN which increases in amplitude at a high rate. The output audio signal SM (=S20−S10) of the subtracter 9 propagates through the low pass filter 3, being added to the input audio signal SIN by the adder 4. The output audio signal SM (=S20−S10) of the subtracter 9 serves as an effect signal to be combined with the input audio signal SIN. Since the effect signal SM (=S20−S10) reflects every time-domain portion of the input audio signal SIN which increases in amplitude at a high rate, the music represented by the addition-resultant audio signal outputted from the adder 4 has emphasized volume-abruptly-increasing portions. In other words, the addition of the effect signal SM produces an amplitude expanding effect on every time-domain portion of the input audio signal SIN which increases in amplitude at a high rate. Thus, in the case where the input audio signal SIN comes from a rock-and-roll music source or a pop music source, the music represented by the output audio signal from the adder 4 can be livelier.

On the other hand, in the case where the input audio signal SIN comes from a classical music source, the amplitude of the input audio signal SIN hardly increases at a high rate during playback. Therefore, in this case, the output audio signals S10 and S20 from the ALC circuits 5 and 7 continue to be substantially equal, and the difference signal SM (the output audio signal SM (=S20−S10) from the subtracter 9) virtually remains zero or ineffective. Thus, the input audio signal SIN passes through the adder 4 without being processed. Accordingly, the classical music represented by the output audio signal from the adder 4 can be prevented from being unnatural.

Both the first control voltage applied to the ALC circuit 5 and the second control voltage applied to the ALC circuit 7 are generated from a common signal, that is, the rectification-resultant signal produced by the diode D10. The capacitors C10 and C20 are equal in capacitance. The resistors R10 and R20 are equal in resistance. Accordingly, it is possible to surely and reliably equalize the release times T1R and T2R of the ALC circuits 5 and 7.

Preferably, the amplifier 5B in the ALC circuit 5 is designed so that the output audio signal S10 therefrom will move up and down from the 0-volt level in accordance with audio information. The amplifier 5B may be designed so that the output audio signal S10 therefrom will swing only in a positive range in accordance with audio information. In this case, a capacitor is provided between the output terminal of the amplifier 5B and the anode of the diode D10.

It should be noted that the ALC circuits 5 and 7 may be replaced by ALC circuits of different forms and structures which differ in attack time, but which are substantially equal in other operation characteristics.

Advantages Provided by the Invention

The effect signal SM is generated on the basis of every time-domain portion of the input audio signal SIN which increases in amplitude at a high rate. The effect signal SM represents the difference between the output audio signal S10 from the ALC circuit 5 and the output audio signal S20 from the ALC circuit 7. The effect signal SM undergoes the noise removing process by the low pass filter 3 before being added to the input audio signal SIN by the adder 4. The addition of the effect signal SM produces an amplitude expanding effect on every time-domain portion of the input audio signal SIN which increases in amplitude at a high rate. Thus, in the case where the input audio signal SIN comes from a rock-and-roll music source or a pop music source, the music represented by the output audio signal from the adder 4 can be livelier.

On the other hand, in the case where the input audio signal SIN comes from a classical music source, the amplitude of the input audio signal SIN hardly increases at a high rate during playback. Therefore, in this case, the output audio signals S10 and S20 from the ALC circuits 5 and 7 continue to be substantially equal, and the effect signal SM (=S20−S10) virtually remains zero or ineffective. Thus, the input audio signal SIN passes through the adder 4 without being processed. Accordingly, the classical music represented by the output audio signal from the adder 4 can be prevented from being unnatural.

What is claimed is:

1. An audio effector circuit comprising:
   a first automatic level control circuit for subjecting an input audio signal to automatic level control to generate a first control-resultant audio signal, the first automatic level control circuit having a first predetermined attack time and a first predetermined release time longer than the first predetermined attack time;
   a second automatic level control circuit for subjecting the input audio signal to automatic level control to generate a second control-resultant audio signal, the second automatic level control circuit having a second predetermined attack time and a second predetermined release time, the second predetermined attack time being longer than the first predetermined attack time, the second predetermined release time being substantially equal to the first predetermined release time;
   a subtracter for providing a difference signal representing a difference between the first control-resultant signal generated by the first automatic level control circuit and the second control-resultant signal generated by the second automatic level control circuit; and
   an adder for adding the difference signal generated by the subtracter to the input audio signal.

2. An audio effector circuit as recited in claim 1, further comprising a low pass filter through which the input audio signal passes before reaching the first and second automatic level control circuits.

3. An audio effector circuit as recited in claim 1, further comprising a low pass filter through which the difference signal passes before reaching the adder.

* * * * *